United States Patent
Kim et al.

(10) Patent No.: US 11,074,957 B2
(45) Date of Patent: Jul. 27, 2021

(54) SEMICONDUCTOR DEVICE

(71) Applicant: SK hynix Inc., Icheon-si (KR)

(72) Inventors: Dae Suk Kim, Icheon-si (KR); Jae Il Kim, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 443 days.

(21) Appl. No.: 15/654,999

(22) Filed: Jul. 20, 2017

(65) Prior Publication Data
US 2018/0226119 A1     Aug. 9, 2018

(30) Foreign Application Priority Data
Feb. 9, 2017  (KR) .................. 10-2017-0018269

(51) Int. Cl.
| | | |
|---|---|---|
| *G11C 11/406* | (2006.01) | |
| *G11C 11/402* | (2006.01) | |
| *G11C 5/14* | (2006.01) | |
| *G11C 11/408* | (2006.01) | |
| *G11C 11/403* | (2006.01) | |
| *G06F 1/04* | (2006.01) | |
| *G06F 1/3234* | (2019.01) | |
| *G06F 1/3225* | (2019.01) | |
| *G06F 1/3237* | (2019.01) | |

(52) U.S. Cl.
CPC .......... *G11C 11/40615* (2013.01); *G06F 1/04* (2013.01); *G06F 1/3225* (2013.01); *G06F 1/3237* (2013.01); *G06F 1/3275* (2013.01); *G11C 5/147* (2013.01); *G11C 11/402* (2013.01); *G11C 11/408* (2013.01); *G11C 11/40626* (2013.01); *G11C 11/403* (2013.01); *G11C 2211/4065* (2013.01); *G11C 2211/4067* (2013.01)

(58) Field of Classification Search
CPC ..... G11C 5/147; G11C 11/402; G11C 11/403; G11C 11/40615; G11C 11/40626; G11C 11/408; G11C 2211/4065; G11C 2211/4067; G06F 1/04; G06F 1/3225; G06F 1/3237; G06F 1/3275
See application file for complete search history.

(56) References Cited

U.S. PATENT DOCUMENTS 5,315,130 A  *  5/1994  Hively ................... G11C 5/025
                                                        257/211
7,830,742 B2 * 11/2010  Han ....................... G11C 16/349
                                                        365/230.01
(Continued)

FOREIGN PATENT DOCUMENTS

| KR | 1020150072051 A | 6/2015 | |
|---|---|---|---|
| KR | 1020160035897 A | 4/2016 | |
| WO | WO-2017175392 A1 * | 10/2017 | ....... G11C 11/40615 |

*Primary Examiner* — Richard Elms
*Assistant Examiner* — R Lance Reidlinger
(74) *Attorney, Agent, or Firm* — William Park & Associates Ltd.

(57) ABSTRACT

A semiconductor device includes a period signal generation circuit and an interruption signal generation circuit. The period signal generation circuit generates a period signal in response to a refresh pulse and an end pulse. The interruption signal generation circuit generates an interruption signal for controlling an operation that an address is set as a target address, if the address having the same logic level combination as the target address is inputted while the period signal is enabled.

22 Claims, 16 Drawing Sheets

(56) References Cited

U.S. PATENT DOCUMENTS

2017/0287547 A1* 10/2017 Ito .................. G11C 29/783
2017/0372767 A1* 12/2017 Kang ............... G11C 11/40622
2019/0122722 A1* 4/2019 Yamada ........... G11C 11/40615

* cited by examiner

41

SEMICONDUCTOR DEVICE

CROSS-REFERENCE TO RELATED APPLICATIONS

The present application claims priority under 35 U.S.C 119(a) to Korean Application No. 10-2017-0018269, filed on Feb. 9, 2017, which is incorporated herein by references in its entirety.

BACKGROUND

1. Technical Field

Embodiments of the present disclosure may generally relate to a semiconductor device and a refresh operation.

2. Related Art

Each semiconductor device may be classified as a dynamic random access memory (DRAM) device, and may consist of a plurality of memory cells for storing data. Each of the DRAM cells may be configured to include a cell capacitor and a cell transistor. The DRAM devices may store data therein by discharging or charging the cell capacitors. Once the cell capacitor is charged or discharged to store a datum therein, an amount of electric charges stored in the cell capacitor has to be constant, ideally, even though time elapses. However, the amount of electric charges stored in the cell capacitor may actually vary because of a voltage difference between the cell capacitor and a circuit adjacent to the cell capacitor or because of a leakage current of the cell capacitor. In particular, if the amount of electric charges stored in the cell capacitor is reduced, the cell capacitor may lose a datum stored therein causing malfunction of the DRAM device. Thus, the DRAM devices may require a refresh operation to prevent the memory cells from losing the data stored therein.

As the semiconductor devices become more highly integrated with the development of process technologies, a distance between the memory cells as well as a distance between word lines connected to the memory cells have been continuously reduced. If a distance between the word lines is reduced, data stored in the adjacent memory cells may be changed due to a coupling phenomenon or an interference phenomenon between the word lines connected to the adjacent memory cells.

SUMMARY

According to an embodiment, a semiconductor device may be provided. The semiconductor device may include a period signal generation circuit and an interruption signal generation circuit. The period signal generation circuit may be configured to generate a period signal based on a refresh pulse. The interruption signal generation circuit may be configured to generate an interruption signal for controlling an operation whereby an address is set as a target address, if the address having the same logic level combination as the target address is inputted while the period signal is enabled.

According to an embodiment, a semiconductor device may be provided. The semiconductor device may include an end pulse generation circuit and an interruption signal generation circuit. The end pulse generation circuit may be configured to generate a control code that is counted in synchronization with a refresh pulse while a period signal is enabled. The interruption signal generation circuit may be configured to generate an interruption signal for controlling an operation whereby an address is set as a target address, if the address having the same logic level combination as the target address is inputted while the period signal is enabled.

According to an embodiment, a semiconductor device may be provided. The semiconductor device may include an interruption signal generation circuit configured to generate an interruption signal for controlling an operation that an address is set as a target address if the address having the same logic level combination as the target address is inputted while a period signal is enabled. The semiconductor device may include a target address generation circuit configured to set the address as the target address based on the interruption signal and an active signal. The semiconductor device may include a control signal input circuit configured to generate an internal refresh signal for controlling a refresh operation of a memory cell selected by the target address from a refresh control signal based on the interruption signal.

According to an embodiment, a semiconductor device may be provided. The semiconductor device may include an interruption signal generation circuit configured to prevent setting an address as a target address by generating an interruption signal when the address for an active operation is identical to the target operation. The address may be set as the target address to perform a refresh operation.

According to an embodiment, a semiconductor device may be provided. The semiconductor device may include an interruption signal generation circuit configured to prevent a duplicate refresh operation from occurring when an address is repeatedly set as a target address.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices executing a refresh operation of memory cells selected by target addresses.

For reference, an embodiment including additional components may be provided. Furthermore, an active high or active low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Figure 1:
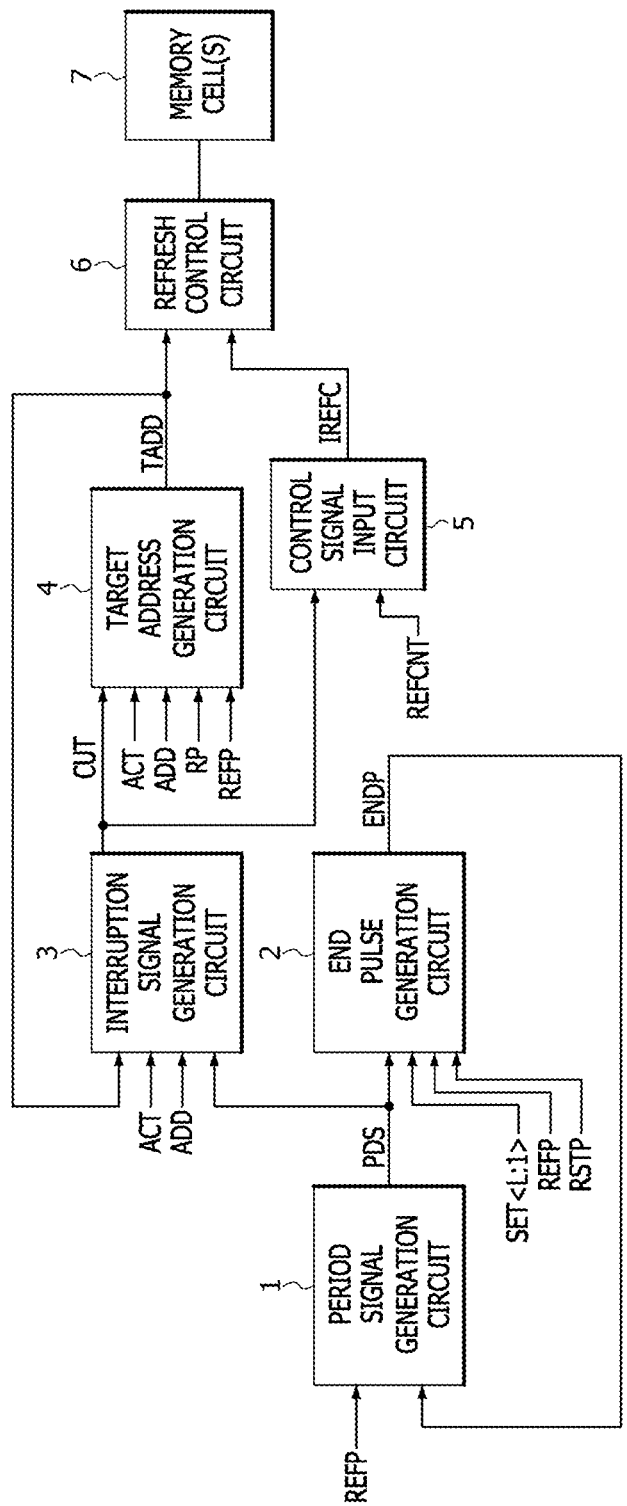
FIG. 1 is a block diagram illustrating a configuration of a semiconductor device according to an embodiment of the present disclosure.

Referring to FIG. 1, a semiconductor device according to an embodiment may include a period signal generation circuit 1, an end pulse generation circuit 2, an interruption signal generation circuit 3, a target address generation circuit 4, a control signal input circuit 5, a refresh control circuit 6, and memory cell(s) 7.

The period signal generation circuit 1 may generate a period signal PDS in response to a refresh pulse REFP and an end pulse ENDP. The period signal generation circuit 1 may generate the period signal PDS which is enabled in synchronization with a point of time that the refresh pulse REFP is created. The period signal generation circuit 1 may generate the period signal PDS which is disabled in synchronization with a point of time that the end pulse ENDP is created. The period signal PDS may maintain an enabled state from a point of time that the refresh pulse REFP is created till a point of time that the end pulse ENDP is created. The refresh pulse REFP may be created if a refresh command (not illustrated) for a refresh operation is inputted to the semiconductor device. The refresh operation may include an auto-refresh operation and a self-refresh operation. The end pulse ENDP may be created if the refresh pulse REFP is created a predetermined number of times.

The end pulse generation circuit 2 may generate the end pulse ENDP in response to the period signal PDS, a set code SET<L:1>, the refresh pulse REFP and a reset pulse RSTP. The end pulse generation circuit 2 may output the end pulse ENDP which is created if the number of times that the refresh pulse REFP is created while the period signal PDS is enabled is equal to a value which is set by the set code SET<L:1>. The value which is set by the set code SET<L:1> and the number "L" of bits included in the set code SET<L:1> may be set to be different according to the embodiments. The end pulse generation circuit 2 may initialize the number of times that the refresh pulse REFP is created, in response to the reset pulse RSTP. The reset pulse RSTP may be created for an initialization operation of the semiconductor device and may be generated in the semiconductor device or provided by an external device.

The interruption signal generation circuit 3 may generate an interruption signal CUT in response to the period signal PDS, an active signal ACT, a target address TADD and an address ADD. The interruption signal generation circuit 3 may generate the interruption signal CUT which is enabled if the address ADD inputted in synchronization with the active signal ACT while the period signal PDS is enabled is identical to the target address TADD. The interruption signal generation circuit 3 may generate the interruption signal CUT which is enabled to terminate an operation that the address ADD is set as the target address TADD when the address ADD for an active operation is identical to the target address TADD. The address ADD may be provided by an external device to selectively access to desired memory cells 7 included in the semiconductor device. The target address TADD may be set by the address ADD to perform the refresh operation.

The target address generation circuit 4 may generate the target address TADD from the address ADD in response to the interruption signal CUT, the active signal ACT, a random pulse RP and the refresh pulse REFP. The target address generation circuit 4 may interrupt the input of the active signal ACT to terminate an operation that generates the target address TADD from the address ADD, if the interruption signal CUT is enabled. The target address generation circuit 4 may be sequentially synchronized with the active signal ACT, the random pulse RP and the refresh pulse REFP to successively latch the address ADD and to generate the target address TADD, while the interruption signal CUT is disabled. The random pulse RP may be created at an arbitrary point of time. The point of time that the random pulse RP is created may be set to be different according to the embodiments.

The control signal input circuit 5 may generate an internal refresh signal IREFC from a refresh control signal REFCNT in response to the interruption signal CUT. The control signal input circuit 5 may terminate an operation that generates the internal refresh signal IREFC from the refresh control signal REFCNT, if the interruption signal CUT is enabled. The control signal input circuit 5 may buffer the refresh control signal REFCNT to generate the internal refresh signal IREFC, if the interruption signal CUT is disabled. The refresh control signal REFCNT may be enabled to perform the refresh operation of memory cells 7 selected by the target address TADD. The refresh control signal REFCNT may be provided by an external device or may be generated in the semiconductor device. A logic level of the refresh control signal REFCNT which is enabled may be set to be different according to the embodiments. The refresh operation performed with the target address TADD may include a refresh operation of first memory cells selected by the target address TADD and a refresh operation of second memory cells adjacent to the first memory cells selected by the target address TADD.

The refresh control circuit 6 may control the refresh operation in response to the target address TADD and the internal refresh signal IREFC. The refresh control circuit 6 may control a refresh operation of memory cells 7 selected by the target address if the internal refresh signal IREFC is enabled. The refresh control circuit 6 may control a refresh operation of memory cells adjacent to the memory cells selected by the target address if the internal refresh signal IREFC is enabled.

Figure 2:
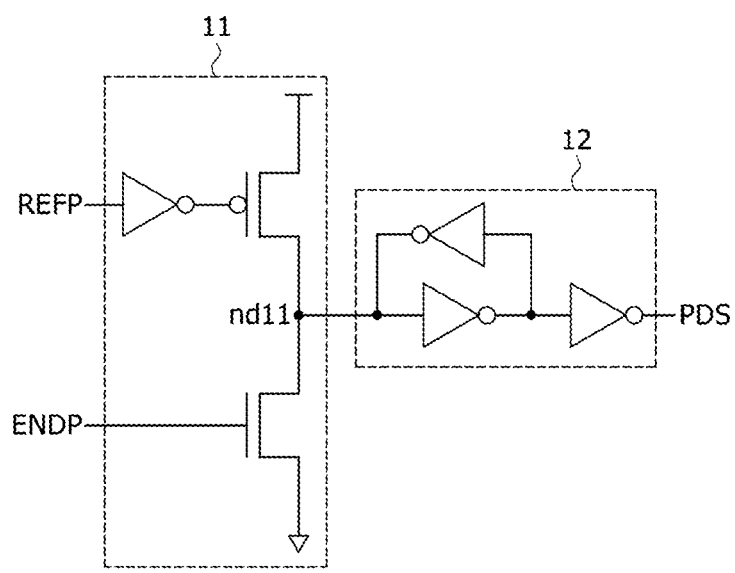
FIG. 2 is a circuit diagram illustrating an example of a period signal generation circuit included in the semiconductor device of FIG. 1.

Referring to FIG. 2, the period signal generation circuit 1 may include a driver 11 and a latch output circuit 12. The driver 11 may drive a voltage level of a node nd11 in response to the refresh pulse REFP and the end pulse ENDP. The driver 11 may drive the voltage level of the node nd11 to a logic "high" level if the refresh pulse REFP is created. The driver 11 may drive the voltage level of the node nd11 to a logic "low" level if the end pulse ENDP is created. The latch output circuit 12 may generate the period signal PDS in response to the voltage level of the node nd11. The latch output circuit 12 may latch and buffer a signal of the node nd11 and may output the buffered signal as the period signal PDS. The period signal generation circuit 1 having an aforementioned configuration may generate the period signal PDS which is enabled in synchronization with a point of time that the refresh pulse REFP is created and which is disabled in synchronization with a point of time that the end pulse ENDP is created.

Figure 3:
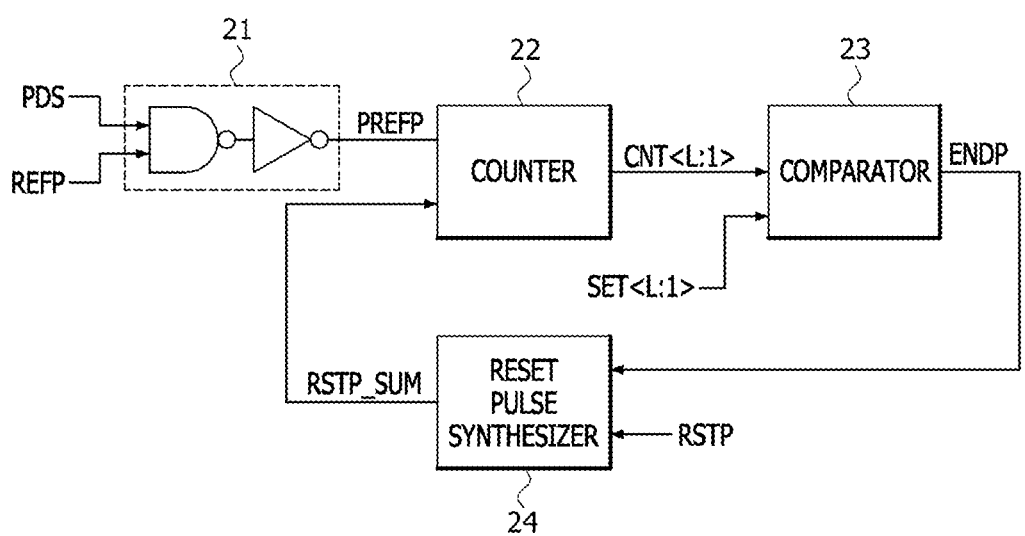
FIG. 3 is a block diagram illustrating an example of an end pulse generation circuit included in the semiconductor device of FIG. 1.

Referring to FIG. 3, the end pulse generation circuit 2 may include a period refresh pulse generator 21, a counter 22, a comparator 23 and a reset pulse synthesizer 24. The reset pulse synthesizer 24 may generate a synthesis reset pulse RSTP_SUM in response to the end pulse ENDP and the reset pulse RSTP. The reset pulse synthesizer 24 may generate the synthesis reset pulse RSTP_SUM if at least one of the end pulse ENDP and the reset pulse RSTP is created.

The period refresh pulse generator 21 may generate a period refresh pulse PREFP in response to the period signal PDS and the refresh pulse REFP. The period refresh pulse generator 21 may buffer the refresh pulse REFP to output the buffered refresh pulse as the period refresh pulse PREFP while the period signal PDS is enabled.

The counter 22 may generate a control code CNT<L:1> in response to the period refresh pulse PREFP and the synthesis reset pulse RSTP_SUM. The counter 22 may count the control code CNT<L:1> whenever the period refresh pulse PREFP is created. For example, if the number "L" of bits included in the control code CNT<L:1> is two, the control code CNT<2:1> may be counted up to have logic level combinations of '00', '01', '10' and '11' in sequence whenever the period refresh pulse PREFP is created. In the control code CNT<L:1>, a logic level combination of '01' means that a first bit CNT<1> of the control code CNT<2:1> has a logic "high" level and a second bit CNT<2> of the control code CNT<2:1> has a logic "low" level. The control code CNT<2:1> may be initialized by the counter 22 to have an initial logic level combination if the synthesis reset pulse RSTP_SUM is created. For example, the control code CNT<2:1> may be set by the counter 22 to have a logic level combination of '00' if the synthesis reset pulse RSTP_SUM is created.

The comparator 23 may generate the end pulse ENDP in response to the control code CNT<L:1> and a set code SET<L:1>. The comparator 23 may generate the end pulse ENDP if the control code CNT<L:1> and the set code SET<L:1> have the same logic level combination. The set code SET<L:1> may be set to have a predetermined value. For example, if the number "L" of bits included in the set code SET<L:1> is two, the set code SET<2:1> may be set to have a logic level combination of '10' corresponding to a decimal number of two. The comparator 23 may generate the end pulse ENDP if the control code CNT<L:1>, which is sequentially counted, has the same logic level combination as the set code SET<L:1>.

Figure 4:
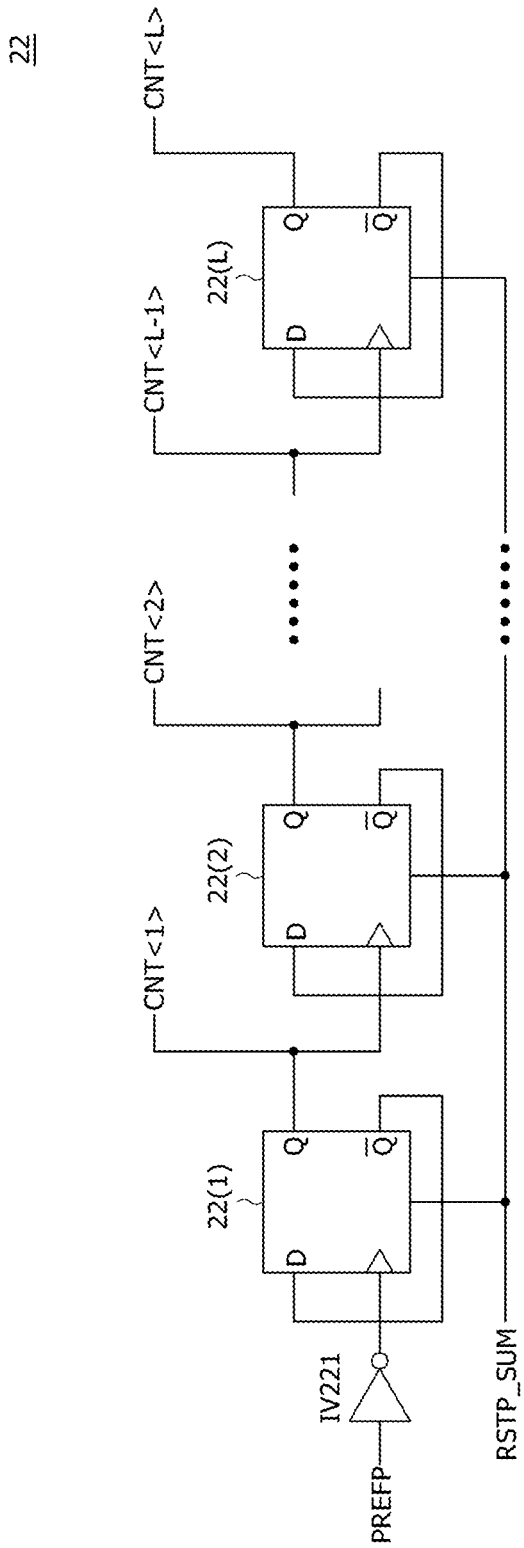
FIG. 4 is a block diagram illustrating an example of a counter included in the end pulse generation circuit of FIG. 3.

Referring to FIG. 4, the counter 22 may include an inverter IV221 and first to $L^{th}$ flip-flops 22(1)~22(L). The inverter IV221 may inversely buffer the period refresh pulse PREFP to output the inversely buffered pulse. The first flip-flop 22(1) may be synchronized with an output signal of the inverter IV221 to generate a first bit CNT<1> of the control code CNT<L:1>. The first flip-flop 22(1) may initialize the first bit CNT<1> of the control code CNT<L:1> if the synthesis reset pulse RSTP_SUM is created. The second flip-flop 22(2) may generate a second bit CNT<2> of the control code CNT<L:1> in response to an output signal of the first flip-flop 22(1). The second flip-flop 22(2) may initialize the second bit CNT<2> of the control code CNT<L:1> if the synthesis reset pulse RSTP_SUM is created. The $L^{th}$ flip-flop 22(L) may generate an $L^{th}$ bit CNT<L> of the control code CNT<L:1> in response to an output signal of the $(L-1)^{th}$ flip-flop 22(L-1) (not illustrated). The $L^{th}$ flip-flop 22(L) may initialize the $L^{th}$ bit CNT<L-1> of the control code CNT<L:1> if the synthesis reset pulse RSTP_SUM is created. The counter 22 having an aforementioned configuration may count up the control code CNT<L:1> bit by bit whenever the period refresh pulse PREFP is created. For example, if the number "L" of bits included in the control code CNT<L:1> is two, the control code CNT<2:1> may be counted up to have logic level combinations of '00', '01', '10' and '11' in sequence whenever the period refresh pulse PREFP is created.

Figure 5:
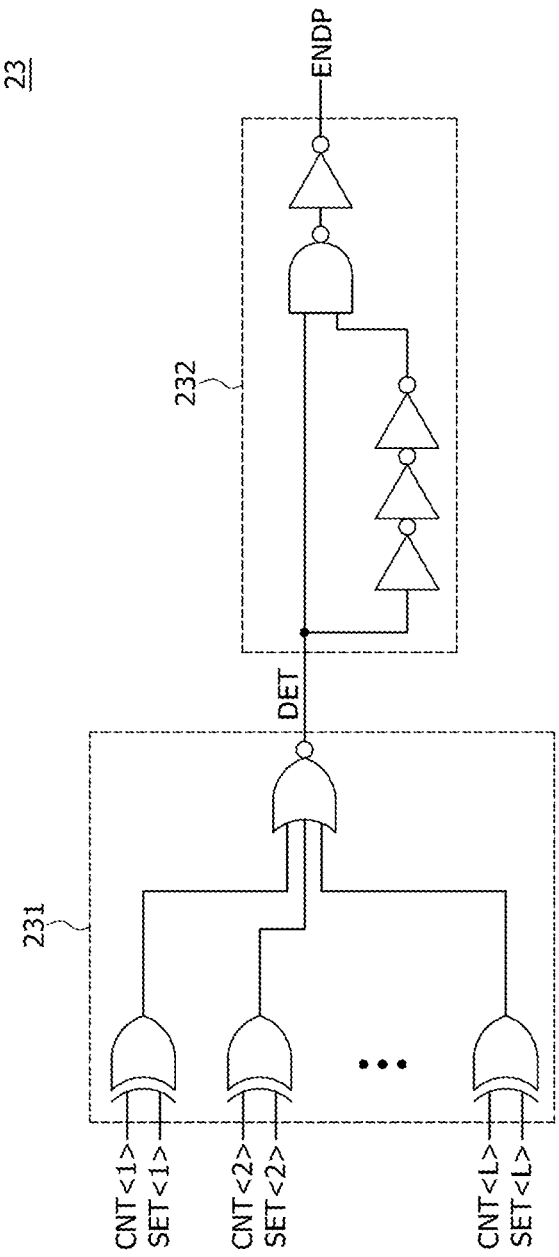
FIG. 5 is a circuit diagram illustrating an example of a comparator included in the end pulse generation circuit of FIG. 3.

Referring to FIG. 5, the comparator 23 may include a detection signal generator 231 and an end pulse output circuit 232. The detection signal generator 231 may generate a detection signal DET in response to the control code CNT<L:1> and the set code SET<L:1>. The detection signal generator 231 may generate the detection signal DET which is enabled if the control code CNT<L:1> and the set code SET<L:1> have the same logic level combination. A logic level of the detection signal DET which is enabled may be set to be different according to the embodiments. The end pulse output circuit 232 may generate the end pulse ENDP in response to the detection signal DET. The end pulse output circuit 232 may generate the end pulse ENDP in synchronization with a point of time that the detection signal DET is enabled.

Figure 6:
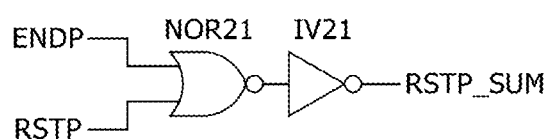
FIG. 6 is a circuit diagram illustrating an example of a reset pulse synthesizer included in the end pulse generation circuit of FIG. 3.

Referring to FIG. 6, the reset pulse synthesizer 24 may perform a NOR operation, and may include for example but not limited to, a NOR gate NOR21. The reset pulse synthesizer 24 may perform an inversion of the result of the NOR operation, and may include for example but not limited to, an inverter IV21. The reset pulse synthesizer 24 may perform an OR operation of the end pulse ENDP and the reset pulse RSTP to generate the synthesis reset pulse RSTP_SUM if at least one of the end pulse ENDP and the reset pulse RSTP is created.

Figure 7:
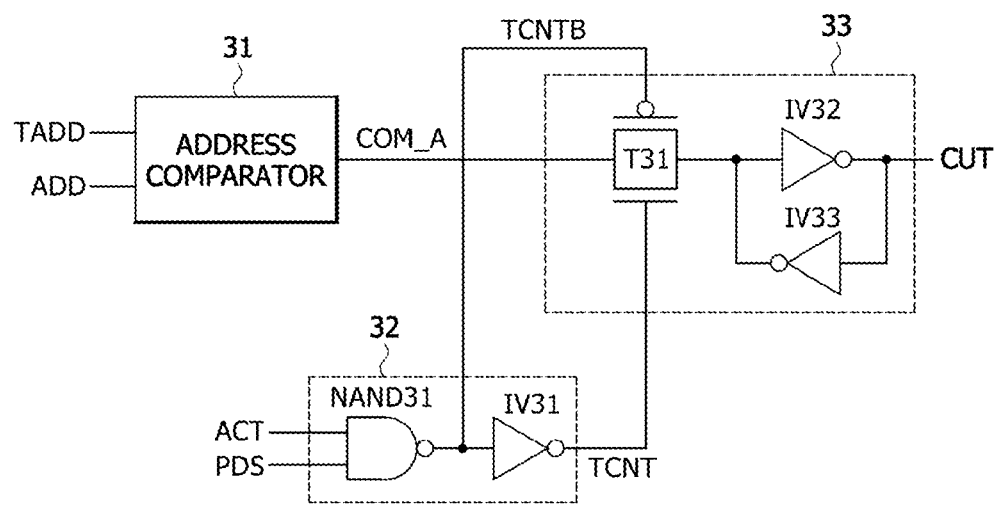
FIG. 7 illustrates an example of an interruption signal generation circuit included in the semiconductor device of FIG. 1.

Referring to FIG. 7, the interruption signal generation circuit 3 may include an address comparator 31, a transmission control signal generator 32 and a selection output circuit 33. The interruption signal generation circuit 3 may generate the interruption signal CUT which is enabled to terminate an operation that the address ADD is set as the target address TADD, if the address ADD for the active operation is identical to the target address TADD.

The address comparator 31 may generate an address comparison signal COM_A in response to the target address TADD and the address ADD. The address comparator 31 may generate the address comparison signal COM_A if the target address TADD is identical to the address ADD. Each of the target address TADD and the address ADD may have a plurality bits according to the embodiments, and that the target address TADD is identical to the address ADD means a case that the target address TADD and the address ADD have the same logic level combination.

The transmission control signal generator 32 may be configured to perform a NAND operation and may include, for example but not limited to, a NAND gate NAND31. The transmission control signal generator 32 may be configured to perform an inversion operation and may include, for example but not limited to, an inverter IV31. The transmission control signal generator 32 may generate a transmission control signal TCNT in response to the active signal ACT and the period signal PDS. The transmission control signal generator 32 may generate the transmission control signal TCNT which is enabled if the active signal ACT is enabled to execute the active operation and an inverted transmission control signal TCNTB corresponding to a complementary signal of the transmission control signal TCNT, while the period signal PDS is enabled. If the transmission control signal TCNT is enabled to have a logic "high" level, the inverted transmission control signal TCNTB may be enabled to have a logic "low" level.

The selection output circuit 33 may include a transfer gate T31 and inverters IV32 and IV33. The selection output circuit 33 may generate the interruption signal CUT from the address comparison signal COM_A in response to the transmission control signal TCNT. The selection output circuit 33 may buffer the address comparison signal COM_A passing through the transfer gate T31 which is turned on if the transmission control signal TCNT is enabled to have a logic "high" level and the inverted transmission control signal TCNTB is enabled to have a logic "low" level and may output the buffered address comparison signal as the interruption signal CUT.

Figure 8:
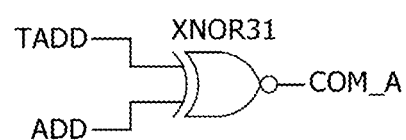
FIG. 8 is a circuit diagram illustrating an example of an address comparator included in the interruption signal generation circuit of FIG. 7.

Referring to FIG. 8, the address comparator 31 may be configured to perform an exclusive NOR operation and may include, for example but not limited to, an exclusive NOR gate. The address comparator 31 may generate the address comparison signal COM_A which is enabled to have a logic "high" level if the target address TADD is identical to the address ADD.

Figure 9:
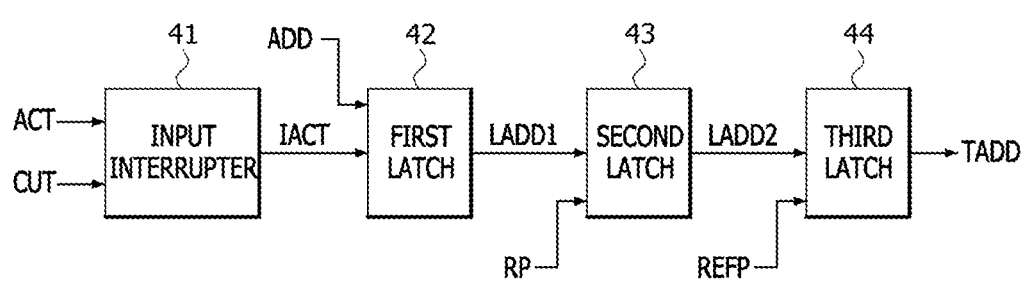
FIG. 9 is a block diagram illustrating an example of a target address generation circuit included in the semiconductor device of FIG. 1.

Referring to FIG. 9, the target address generation circuit 4 may include an input interrupter 41, a first latch 42, a second latch 43 and a third latch 44. The input interrupter 41 may generate an internal active signal IACT in response to the active signal ACT and the interruption signal CUT. The input interrupter 41 may buffer the active signal ACT to generate the internal active signal IACT while the interruption signal CUT is disabled. The input interrupter 41 may stop an operation for generating the internal active signal IACT from the active signal ACT while the interruption signal CUT is enabled. The first latch 42 may generate a first latch address LADD1 from the address ADD in response to the internal active signal IACT. The first latch 42 may latch the address ADD to generate the first latch address LADD1 if the internal active signal IACT is enabled. The second latch 43 may generate a second latch address LADD2 from the first latch address LADD1 in response to the random pulse RP. The second latch 42 may latch the first latch address LADD1 to generate the second latch address LADD2 if the random pulse RP is created. The third latch 44 may generate the target address TADD from the second latch address LADD2 in response to the refresh pulse REFP. The third latch 43 may latch the second latch address LADD2 to generate the target address TADD if the refresh pulse REFP is created. The target address generation circuit 4 may interrupt the input of the active signal ACT to terminate an operation for generating the target address TADD from the address ADD, if the interruption signal CUT is enabled. The target address generation circuit 4 may be sequentially synchronized with the active signal ACT, the random pulse RP and the refresh pulse REFP to successively latch the address ADD and to generate the target address TADD, while the interruption signal CUT is disabled.

Figure 10:
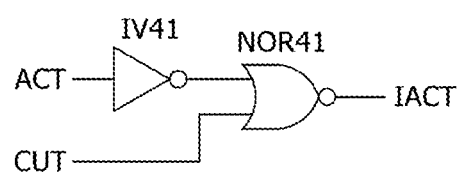
FIG. 10 is a circuit diagram illustrating an example of an input interrupter included in the target address generation circuit of FIG. 9.

Referring to FIG. 10, the input interrupter 41 may be configured to perform an inversion operation and may include, for example but not limited to, an inverter IV41. The input interrupter 41 may be configured to perform a NOR operation and may include, for example but not limited to, a NOR gate NOR41. The input interrupter 41 may buffer the active signal ACT with the inverter IV41 and the NOR gate NOR41 to generate the internal active signal IACT while the interruption signal CUT is disabled to have a logic "low" level. The input interrupter 41 may generate the internal active signal IACT which is disabled to have a logic "low" level regardless of the active signal ACT while the interruption signal CUT is enabled to have a logic "high" level.

Figure 11:
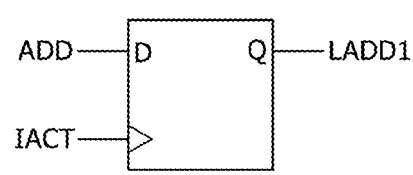
FIG. 11 is a block diagram illustrating an example of a first latch included in the target address generation circuit of FIG. 9.

Referring to FIG. 11, the first latch 42 may be realized using, for example but not limited to, a flip-flop. The first latch 42 may latch the address ADD to generate the first latch address LADD1 if the internal active signal IACT is enabled.

Figure 12:
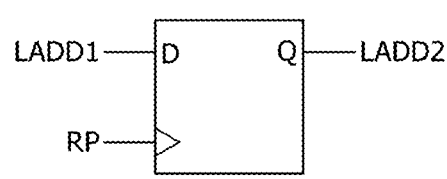
FIG. 12 is a block diagram illustrating an example of a second latch included in the target address generation circuit of FIG. 9.

Referring to FIG. 12, the second latch 43 may be realized using, for example but not limited to, a flip-flop. The second latch 43 may latch the first latch address LADD1 to generate the second latch address LADD2 if the random pulse RP is created.

Figure 13:
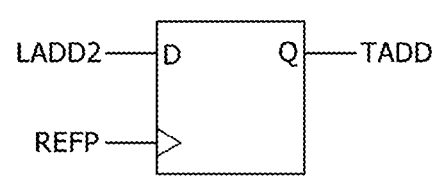
FIG. 13 is a block diagram illustrating an example of a third latch included in the target address generation circuit of FIG. 9.

Referring to FIG. 13, the third latch 44 may be realized using, for example but not limited to, a flip-flop. The third latch 44 may latch the second latch address LADD2 to generate the target address TADD if the refresh pulse REFP is created.

Figure 14:
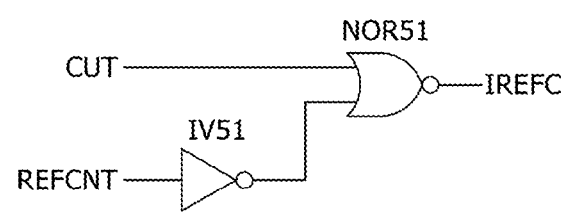
FIG. 14 is a circuit diagram illustrating an example of a control signal input circuit included in the semiconductor device of FIG. 1.

Referring to FIG. 14, the control signal input circuit 5 may be configured to perform an inversion operation and may include, for example but not limited to, an inverter IV51. The control signal input circuit 5 may be configured to perform a NOR operation and may include, for example but not limited to, a NOR gate NOR51. The control signal input circuit 5 may generate the internal refresh signal IREFC which is disabled to have a logic "low" level regardless of the refresh control signal REFCNT if the interruption signal CUT is enabled to have a logic "high" level. The control signal input circuit 5 may buffer the refresh control signal REFCNT with the inverter IV51 and the NOR gate NOR51 to generate the internal refresh signal IREFC if the interruption signal CUT is disabled to have a logic "low" level.

Figure 15:
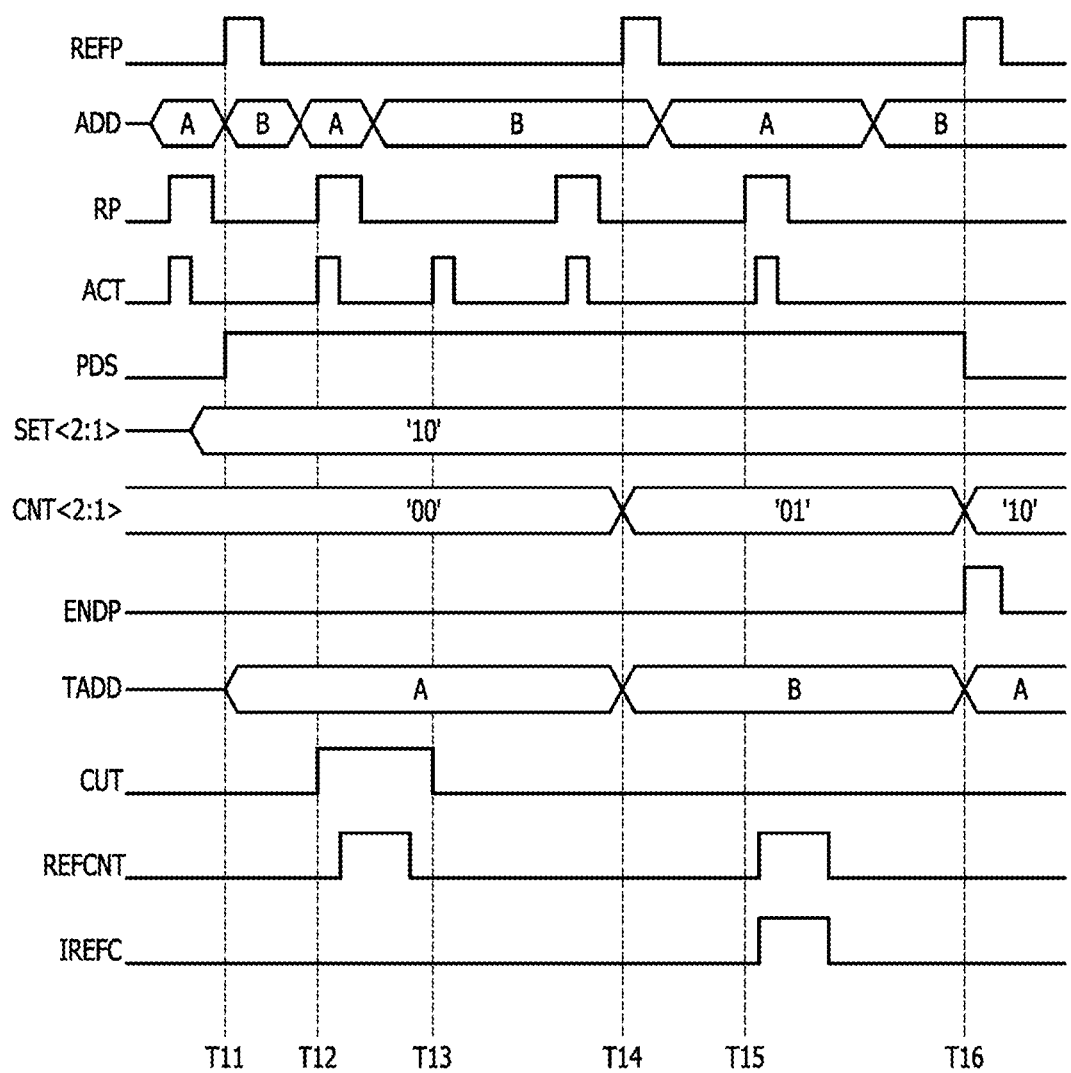
FIG. 15 is a timing diagram illustrating an operation of the semiconductor device illustrated in FIGS. 1 to 14.

An operation of the semiconductor device having an aforementioned configuration will be described hereinafter with reference to FIG. 15.

The address ADD having a first logic level combination A inputted to the semiconductor device in synchronization with the random pulse RP and a pulse of the active signal ACT which are created before a point of time "T11" may be latched. At the point of time "T11", the address ADD having the first logic level combination A may be set as the target address TADD. The period signal PDS may be enabled to have a logic "high" level in synchronization with the refresh pulse REFP which is created at the point of time "T11".

Since the first logic level combination A of the address ADD inputted in synchronization with the random pulse RP and a pulse of the active signal ACT which are created at a point of time "T12" is identical to a logic level combination of the target address TADD, the interruption signal CUT may be enabled to have a logic "high" level. The interruption signal CUT may be disabled to have a logic "low" level in synchronization with a pulse of the active signal ACT which is created at a point of time "T13". During a period from the point of time "T12" till the point of time "T13", an operation that the address having the first logic level combination A is set as the target address TADD may be interrupted by the interruption signal CUT having a logic "high" level. In addition, during a period from the point of time "T12" till the point of time "T13", an operation generating the internal refresh signal IREFC from the refresh control signal REFCNT may also be interrupted by the interruption signal CUT having a logic "high" level.

The address ADD having a second logic level combination B latched in synchronization with the refresh pulse REFP which is created at a point of time "T14" may be set as the target address TADD. At the point of time "T14", the control code CNT<2:1> having a logic level combination of '00' may be counted in synchronization with the refresh pulse REFP to have a logic level combination of '01'.

The address ADD having the second logic level combination B inputted in synchronization with the random pulse RP and a pulse of the active signal ACT which are sequentially created after a point of time "T15" may be latched. Since the first logic level combination A of the address ADD is different from a logic level combination (i.e., the second logic level combination B) of the target address TADD, the interruption signal CUT may maintain the disabled state having a logic "low" level. Thus, the internal refresh signal IREFC may be enabled to have a logic "high" level by the refresh control signal REFCNT which is enabled, and the refresh operation of memory cells selected by the target address TADD having the second logic level combination B may be performed.

The address ADD having the first logic level combination A latched in synchronization with the refresh pulse REFP which is created at a point of time "T16" may be set as the target address TADD. At the point of time "T16", the control code CNT<2:1> having a logic level combination of '01' may be counted in synchronization with the refresh pulse REFP to have a logic level combination of '10'. Since the control code CNT<2:1> and the set code SET<2:1> have the same logic level combination at the point of time "T16", the end pulse ENDP may be created. The period signal PDS may be disabled to have a logic "low" level by the end pulse ENDP which is created at the point of time "T16".

As described above, a semiconductor device according to an embodiment may skip an operation that an address is repeatedly set as a target address and may stop a duplicate refresh operation of memory cells selected by the target address, if the address having the same logic level combination as the target address is inputted. As a result, the efficiency of the refresh operation may be improved and the power consumption of the semiconductor device may be reduced.

Figure 16:
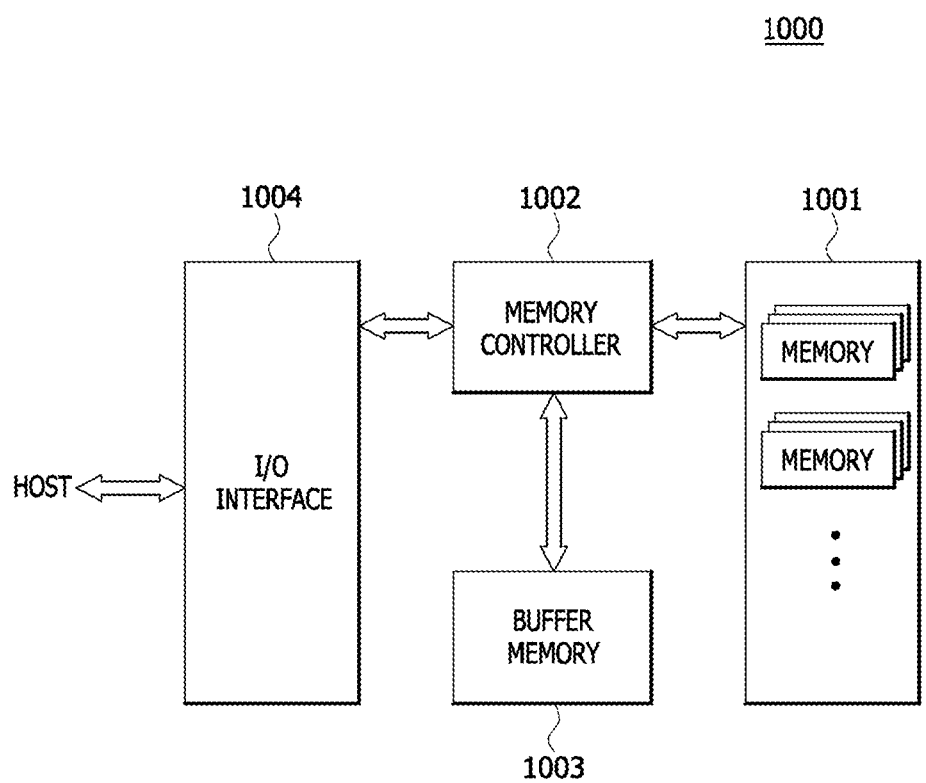
FIG. 16 is a block diagram illustrating a configuration of an electronic system employing the semiconductor device illustrated in FIGS. 1 to 14.

The semiconductor device described with reference to FIGS. 1 to 15 may be applied to an electronic system that includes a memory system, a graphic system, a computing system, a mobile system, or the like. For example, as illustrated in FIG. 16, an electronic system 1000 according an embodiment may include a data storage circuit 1001, a memory controller 1002, a buffer memory 1003, and an input and output (input/output) (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 16 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:
1. A semiconductor device comprising:
   a target address generation circuit configured to set an address inputted in synchronization with an active signal as a target address based on an interruption signal;

a period signal generation circuit configured to generate a period signal based on a refresh pulse; and
an interruption signal generation circuit configured to compare the address with the target address to generate the interruption signal while the period signal is enabled.

2. The semiconductor device of claim 1, wherein the refresh pulse is created to perform a refresh operation.

3. The semiconductor device of claim 1,
wherein the period signal generation circuit is configured to generate the period signal based on the refresh pulse and an end pulse, and
wherein the end pulse is created if the refresh pulse is created a predetermined number of times.

4. The semiconductor device of claim 1,
wherein the period signal generation circuit is configured to generate the period signal based on the refresh pulse and an end pulse, and
wherein the period signal is enabled in synchronization with a point of time that the refresh pulse is created and is disabled in synchronization with a point of time that the end pulse is created.

5. The semiconductor device of claim 1, further comprising an end pulse generation circuit configured to generate a control code that is counted in synchronization with the refresh pulse while the period signal is enabled and configured to compare the control code with a set code to generate an end pulse,
wherein the period signal generation circuit is configured to generate the period signal based on the refresh pulse and the end pulse.

6. The semiconductor device of claim 5, wherein the end pulse generation circuit includes:
a period refresh pulse generator configured to generate a period refresh pulse based on the period signal and the refresh pulse;
a counter configured to count the control code in synchronization with the period refresh pulse;
a comparator configured to compare the control code with the set code to generate the end pulse; and
a reset pulse synthesizer configured to generate a synthesis reset pulse for initializing the control code based on the end pulse and a reset pulse.

7. The semiconductor device of claim 1, wherein the interruption signal generation circuit includes:
an address comparator configured to compare the address with the target address to generate an address comparison signal;
a transmission control signal generator configured to generate a transmission control signal based on an active signal and the period signal; and
a selection output circuit configured to generate the interruption signal from the address comparison signal based on the transmission control signal.

8. The semiconductor device of claim 1, wherein the target address generation circuit includes:
an input interrupter configured to buffer the active signal based on the interruption signal to generate an internal active signal;
a first latch configured to latch the address based on the internal active signal to generate a first latch address;
a second latch configured to latch the first latch address in synchronization with a random pulse to generate a second latch address; and
a third latch configured to latch the second latch address in synchronization with the refresh pulse to generate the target address.

9. The semiconductor device of claim 1, further comprising a control signal input circuit configured to generate an internal refresh signal for controlling a refresh operation of a memory cell selected by the target address from a refresh control signal based on the interruption signal.

10. A semiconductor device comprising:
a target address generation circuit configured to set an address inputted in synchronization with an active signal as a target address based on an interruption signal;
an end pulse generation circuit configured to generate a control code that is counted in synchronization with a refresh pulse while the period signal is enabled and compare the control code with a set code to generate an end pulse to control a period signal; and
an interruption signal generation circuit configured to generate the interruption signal while the period signal is enabled.

11. The semiconductor device of claim 10,
wherein the end pulse generation circuit includes:
a period refresh pulse generator configured to generate a period refresh pulse based on the period signal and the refresh pulse;
a counter configured to count the control code in synchronization with the period refresh pulse;
a comparator configured to compare the control code with the set code to generate the end pulse; and
a reset pulse synthesizer configured to generate a synthesis reset pulse for initializing the control code based on the end pulse and a reset pulse.

12. The semiconductor device of claim 10, wherein the interruption signal generation circuit includes:
an address comparator configured to compare the address with the target address to generate an address comparison signal;
a transmission control signal generator configured to generate a transmission control signal based on an active signal and the period signal; and
a selection output circuit configured to generate the interruption signal from the address comparison signal based on the transmission control signal.

13. The semiconductor device of claim 10, further comprising a period signal generation circuit configured to generate the period signal based on the refresh pulse and an end pulse,
wherein the end pulse generation circuit is configured to compare the control code with a set code to generate the end pulse.

14. The semiconductor device of claim 13, wherein the period signal is enabled in synchronization with a point of time that the refresh pulse is created and is disabled in synchronization with a point of time that the end pulse is created.

15. The semiconductor device of claim 10, wherein the target address generation circuit includes:
an input interrupter configured to buffer the active signal based on the interruption signal to generate an internal active signal;
a first latch configured to latch the address based on the internal active signal to generate a first latch address;
a second latch configured to latch the first latch address in synchronization with a random pulse to generate a second latch address; and
a third latch configured to latch the second latch address in synchronization with the refresh pulse to generate the target address.

16. The semiconductor device of claim 10, further comprising a control signal input circuit configured to generate an internal refresh signal for controlling a refresh operation of a memory cell selected by the target address from a refresh control signal based on the interruption signal.

17. A semiconductor device comprising:
an interruption signal generation circuit configured to compare an address inputted in synchronization with an active signal with a target address generate an interruption signal while a period signal is enabled;
a target address generation circuit configured to set the address as the target address based on the interruption signal; and
a control signal input circuit configured to generate an internal refresh signal for controlling a refresh operation of a memory cell selected by the target address from a refresh control signal based on the interruption signal.

18. The semiconductor device of claim 17, further comprising:
a period signal generation circuit configured to generate the period signal based on a refresh pulse and an end pulse; and
an end pulse generation circuit configured to generate a control code that is counted based on the period signal and the refresh pulse and configured to compare the control code with a set code to generate the end pulse.

19. A semiconductor device comprising:
an interruption signal generation circuit configured to generate an interruption signal if an address having the same logic level combination as the target address is inputted while a period signal is enabled, and
a target address generation circuit configured to generate the target address from the address based on a refresh pulse and the interruption signal.

20. The semiconductor device of claim 19, further comprising:
a period signal generation circuit configured to generate a period signal based on a refresh pulse.

21. The semiconductor device of claim 19, further comprising:
an end pulse generation circuit configured to generate a control code that is counted in synchronization with a refresh pulse while a period signal is enabled.

22. The semiconductor device of claim 19, wherein the interruption signal generation circuit includes:
an address comparator configured to compare the address with the target address to generate an address comparison signal;
a transmission control signal generator configured to generate a transmission control signal based on an active signal and the period signal; and
a selection output circuit configured to generate the interruption signal from the address comparison signal based on the transmission control signal.

* * * * *